United States Patent
Motz

(10) Patent No.: US 6,362,618 B1
(45) Date of Patent: Mar. 26, 2002

(54) HALL SENSOR FOR STRESS AND TEMPERATURE MEASUREMENTS IN ADDITION TO MAGNETIC FIELD MEASUREMENT

(75) Inventor: Mario Motz, St. Magdalen (AT)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/467,150

(22) Filed: Dec. 20, 1999

(30) Foreign Application Priority Data

Dec. 19, 1998 (DE) .......................................... 198 58 868

(51) Int. Cl.$^7$ .............................................. G01R 33/06
(52) U.S. Cl. ........................ 324/251; 324/225; 327/511
(58) Field of Search ............................ 324/251, 207.12, 324/225; 327/510, 511

(56) References Cited

U.S. PATENT DOCUMENTS

| | | |
|---|---|---|
| 5,055,768 A | 10/1991 | Plagens |
| 5,260,614 A * | 11/1993 | Theus et al. ................. 307/491 |
| 5,406,202 A * | 4/1995 | Mehrgardt et al. .......... 324/251 |
| 5,604,433 A | 2/1997 | Theus et al. ................. 324/251 |
| 5,747,995 A | 5/1998 | Spies ..................... 324/207.2 |

FOREIGN PATENT DOCUMENTS

| | | |
|---|---|---|
| DE | 4302342 A1 | 7/1993 |
| DE | 4431703 C2 | 3/1996 |
| EP | 0525235 A1 | 7/1991 |
| EP | 0 450 910 | 10/1991 |
| EP | 0548391 A1 | 12/1991 |

* cited by examiner

Primary Examiner—Jay Patidar
(74) Attorney, Agent, or Firm—Gudrun E. Huckett

(57) ABSTRACT

A Hall sensor has a Hall plate having terminals for supplying a supply current and for tapping a Hall voltage. A Hall circuit connects the terminals. A device for orthogonally switching the supply current and the Hall voltage between a first set of the terminals and a second set of the terminals, arranged orthogonally to the first set of terminals, is provided wherein a geometry of the Hall plate is identical for the first and second sets of the terminals. A summation device is configured to receive measured Hall voltage values from the first and second sets of the terminals and to determine an offset-compensated Hall voltage value. The summation device is configured to receive and/or process the Hall voltage values of the first and second set of the terminals such that, for stress measurement, a portion of the Hall voltage values resulting from the magnetic field acting on the Hall sensor are compensated and only the portion of the Hall voltage values resulting from the offset are measured. A temperature measurement is possible wherein at least one current of the Hall sensor circuit having a predetermined temperature coefficient is used whose voltage drop at the resistor of the Hall circuitry is determined for temperature measurement.

18 Claims, 3 Drawing Sheets

HALL SENSOR FOR STRESS AND TEMPERATURE MEASUREMENTS IN ADDITION TO MAGNETIC FIELD MEASUREMENT

BACKGROUND OF THE INVENTION

The present invention relates to a Hall sensor comprising a device for orthogonally switching the Hall sensor supply current as well as the Hall voltage tapping, whereby the geometry of the Hall plate in the orthogonal positions for the Hall voltage determination is identical, comprising also a summation device to which the Hall voltage values of the orthogonal positions are sent for determining an offset-compensated Hall voltage value.

Hall sensors are used for measuring magnetic fields. The Hall sensor is especially embodied as a monolithic integrated component which comprises the Hall sensor, the current supply, and the electronic evaluation circuit for the Hall voltage. For manufacturing this combined circuit, conventional silicon semiconductor technology is conventionally used which corresponds to the common bipolar or MOS manufacturing processes.

A known disadvantage of silicon as a Hall detector material is the great effect of mechanical loading (the so-called stress), i.e., the piezoelectric effect and/or piezoresistive effect (permanent resistor changes upon deformation). These result in offset voltage errors which are caused by the mechanical stresses in the crystal structure and the direction-dependent Hall sensitivity. For this reason, offset-compensated Hall sensors, especially Hall sensors with orthogonal switching are known (see, for example, European Patent Document 0 548 391). The basic idea is that a rotation-symmetrical, for example, square, Hall plate is electrically switched by 90° and the resulting measured values are added or subtracted. For determining the offset error, the Hall plate can be viewed in approximation as a bridge circuit. For an ideal or true behavior as a bridge circuit for this orthogonal switching, the offset error occurs always with the opposite sign so that overlying the two orthogonal Hall voltages thus the substantially completely compensates the offset error in this manner. Both orthogonal measurements are thus performed with the same identical structure and a single stress profile. In this manner, the stress, as mentioned above, can be compensated.

The mechanical stress which acts on the Hall sensor with the result of an undesirable piezo voltage thus causes offset problems. Such mechanical stress can result, for example, after potting of the Hall sensor in a module. Also, a pressure application onto the Hall plates or the circuit can result in internal mechanical stress. However, in certain situations it is important to know the magnitude of this stress. The problem is that the precise value of the stress for different Hall sensors is not reproducible and thus must be measured for each Hall sensor individually in order to be able to evaluate the stress after potting of the Hall sensor, i.e., to measure it or even compensate it when using the Hall sensor.

Furthermore, it is partially important that in addition to the magnitude of the stress also the temperature of the Hall sensor is known in order to provide compensation of these errors.

Based on this, it is an object of the present invention to be able to perform, in addition to the conventional magnetic field measurement by the Hall sensor, also a measurement of the stress present within the Hall sensor and/or of the temperature of the Hall sensor.

SUMMARY OF THE INVENTION

The technical solution for measuring the stress is characterized in that the Hall voltage values of the orthogonal positions are supplied to and/or processed in the summation device such that the portions of the Hall voltage values caused by the magnetic field are compensated and that only the portions of the Hall voltage values caused by the offset can be measured.

This provides a Hall sensor with integrated stress measurement. The basic idea of the invention is that as an alternative to the conventional measurement of the magnetic field by the Hall sensor with a respective switching of the Hall plate terminals stress can be measured. For this stress measurement the optionally present magnetic field is compensated and is thus not measured. For orthogonal switching, the offset error will occur always with the same sign so that overlying of the two orthogonal Hall voltages, in contrast to the magnetic field measurement, will not result in a compensation of the offset error in the subsequent signal processing unit. However, the magnetic field portions of the orthogonal Hall voltages are compensated because they occur with different signs. The thus measured stress in the Hall sensor can be used for examining and testing the total system. Furthermore, the stress signal can be used for compensation of errors. Technically, this can be realized in that the Hall sensor can be switched by external control signals to the respective measurement value output. Accordingly, it is possible with already present switching means to switch from output of magnetic field to the output of internal mechanical stress so that the stress of the Hall plate is determined. The embodiment thus allows a separate measurement of the magnetic field and of the stress.

A technical realization of the magnetic field measurement is that an orthogonal switching is still performed for the stress measurement but with a 90° rotation with respect to the magnetic field measurement of the Hall plate supply current for the two half phases. In the second half phase the tapping of the Hall voltage remains unchanged (so that the signs for the Hall voltage at the input of the differential amplifier will not change), but the direction of the provided supply current for the Hall sensor in comparison to the magnetic field measurement is reversed. The current flow direction through the Hall plate is thus reversed for the stress measurement in comparison to the magnetic field measurement. The already disclosed consequence is that the offset cannot be compensated, as was the case in the magnetic field measurement, but that the offset caused by the stress remains as the resulting value independent of the magnetic field which is compensated because of the two orthogonal measurement values.

As a technical solution for measuring the temperature, at least one current present within the circuit of the Hall sensor and having a predetermined temperature coefficient is used. Its voltage drop at a resistor is used for temperature measurement. Preferably, a single current present in the circuit of the Hall sensor with a predetermined temperature coefficient is used. It is also possible to employ two currents present within the circuit of the Hall sensor which are added or subtracted and have temperature coefficients that differ from one another.

Here the basic idea is also that in addition to the conventional magnetic field measurement a temperature measurement is performed without having to perform at the same time a magnetic field measurement. The digital temperature measurement with simultaneous elimination of the magnetic field measurement employs one or two currents present in the Hall sensor circuit and evaluates them with respect to their behavior with predetermined different temperature coefficients. As an example for generating temperature dependent currents in connection with monolithic integrated Hall sensors reference is made to European Patent Document 0 525 235. When employing a single current, a current with a predetermined temperature coefficient can be used. A second current with a different temperature coefficient can be switched to this first current. With a weighted addition or subtraction of the two currents with their different temperature coefficients, different, temperature dependant currents can be generated, i.e., currents with different temperature coefficients or currents which for a certain reference temperature change their sign (compare FIG. 4). An orthogonal switching is not required during temperature measurement because the switching currents within the Hall sensors are used and not the Hall voltages. The current supply points and voltage tapping at the Hall plate are identical for the temperature measurement. The input of the signal processing arranged downstream can be alternatingly switched. As mentioned in regard with the stress measurement, the Hall sensor can be switched based on external signals to temperature measurement output. It is possible to switch from the output of the magnetic field to the output of the temperature with switching means that are already present within the circuit. This can be realized with a minimum modification of the complete circuit. The temperature measurement in the Hall sensor can be used for examinations and tests of the complete system. Furthermore, the temperature signal can be used for compensation of errors.

The further embodiment of the temperature measurement, wherein the current is switched onto a current distribution point, the resulting partial current is guided to a resistor, and the thus resulting voltage drop is used for further signal processing, has the advantage of a technically simple solution whereby the differential current is switched via switch and a resistor to the already present signal processing unit arranged downstream, for example, in the form of an analog digital converter (ADC). The basic principle is that the available current is supplied to a current distribution node and a partial current of minimal magnitude is removed. Since the outflowing current is smaller than the incoming current, a voltage is observed at a resistor of the current system which is proportional to the temperature dependent differential current which is a measure for the temperature of the Hall sensor.

According to a further embodiment, the supplied current has a first temperature coefficient and the resulting partial current has a second temperature coefficent. This allows an optimized temperature behavior and thus a precise temperature measurement.

According to another embodiment, a band gap circuit with bipolar transistors is provided for generating at least one current. The basic idea is that the base emitter voltage of a bipolar transistor will be reduced with temperature which is caused mainly by a decreasing energy gap within the emitter relative to the base. This band gap effect is the result of high doping within the emitter and can be used for temperature measurement within the Hall sensor.

In yet another embodiment it is suggested that for the temperature measurement the Hall plate is used as the resistor. This provides a simplified embodiment. However, it is also possible to use a separate resistor.

As a further technical solution it is suggested to combine for a selective stress or temperature measurement within one and the same Hall sensor circuit the combination of the aforementioned features in regard to stress measurement and in regard to temperature measurement.

This provides a Hall sensor with respective circuits with which a conventional magnetic field measurement, and selectively also a stress measurement or a temperature measurement (both without magnetic field measurement), is possible. The inventive concept of a common circuitry of an alternative magnetic field measurement, stress measurement or temperature measurement can be realized with minimal modifications of the complete circuit system with the already present components of the conventional magnetic field measurement device. Thus, it is possible with already present switching means to select the desired measuring alternative in order to thus provide in a technically simple measure stress or temperature measurements in the Hall sensor for examinations and tests of the complete system. The stress or temperature signal can also be used for compensation of errors.

A technically simple solution is provided by a common switching device with switches for selectively controlling the three measurement options, i.e., magnetic field measurement, stress measurement, temperature measurement. For signal processing, the signals are preferably digitalized by an analog digital converter (ADC).

A preferred embodiment for measuring the Hall voltage suggests that a device for compensating the Hall voltage and/or stress voltage and/or temperature voltage by a counter coupling voltage is provided. The digitalization of the signal should be performed by a delta sigma converter of a first or higher order. Preferably, a first amplifier is provided which converts the Hall voltage into a current, especially a differential current pair. In a stage arranged downstream, comprising a second amplifier with an integrator, this current is integrated and then further processed as a voltage signal. A device is provided which converts the voltage signal into a counter coupling signal.

The analog voltage of the second amplifier for generating the counter coupling signal is digitalized. When using a delta sigma converter of higher order multiple integration loops are used. The first operational transconductance amplifier (OTA) converts the Hall voltage into a current. The second operational amplifier (OPV) integrates this current, for example, by a capacitor. The resulting voltage at the capacitor is then digitalized by an analog digital converter (ADC). The digital signal is then processed, for example, under certain circumstances partially integrated, and is then converted by a digital analog converter (DAC) into a counter coupling signal and supplied to the voltage tapping terminal as a compensation current into the Hall plate and generates therein via the inner resistor of the Hall plate a counter coupling voltage. The entire system oscillates at the input of the first OTA over a time mean to 0 volts. Thus, the counter coupling voltage compensates the Hall voltage and the digital DAC input signal is a measure for the Hall voltage (delta sigma converter principle). Accordingly, by returning the signal via the correlated back coupling, the system is set to zero.

According to another embodiment, the input of the Hall voltage to the signal processing is cycled. This compensates the offset problem in the signal processing unit arranged downstream, for example, in an ADC unit. For example, the two inputs of the input differential amplifier are exchanged. The orthogonal switching and the cycling can then be performed simultaneously.

BRIEF DESCRIPTION OF THE DRAWINGS

The object and advantages of the present invention will appear more clearly from the following specification in conjunction with the accompanying drawings, in which.

DESCRIPTION OF PREFERRED EMBODIMENTS

The present invention will now be described in detail with the aid of several specific embodiments utilizing FIGS. 1a, 1b through FIGS. 8a, 8b.

Figure 1A:
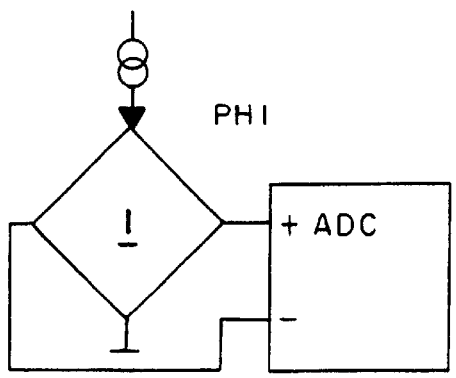
FIGS. 1a, 1b show the principle circuitry of the magnetic field measurement.
Figure 1B:
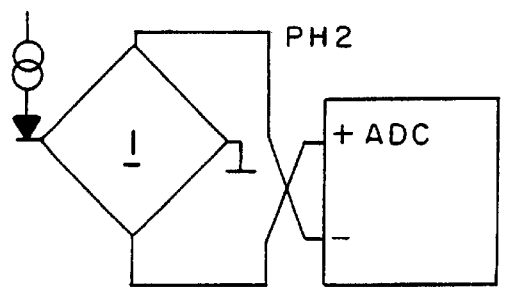

FIGS. 1a and 1b show the conventional magnetic field measurement of a Hall sensor with orthogonal switching. A square Hall plate 1 has four terminals, i.e., two terminals for the Hall sensor supply current as well as two terminals for the Hall voltage tapping. These Hall voltage tapping terminals are connected to an analog digital converter ADC. The Hall plate 1 is, for example, formed by a resistor structure (=Rwell) which is realized in CMOS technology by a tub structure.

The function for the magnetic field measurement is as follows.

By an orthogonal switching step (compare FIG. 1b to FIG. 1a), the terminals for the Hall sensor supply current as well as the Hall voltage terminals are switched by a respective switch control (not shown in the drawings) for switching in a counter clockwise direction. At the same time, the terminals of the Hall voltage tapping at the analog digital converter ADC are also switched by chopping. The effect of the orthogonal switching is that the offset errors in the two orthogonal Hall voltage values caused by stress will be determined with different signs and will compensate upon summation in a summation unit which is arranged downstream of the analog digital converter ADC.

Figure 2A:
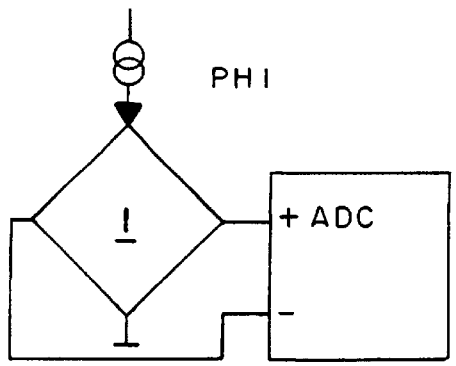
FIGS. 2a, 2b show the principle circuitry of the stress measurement.
Figure 2B:
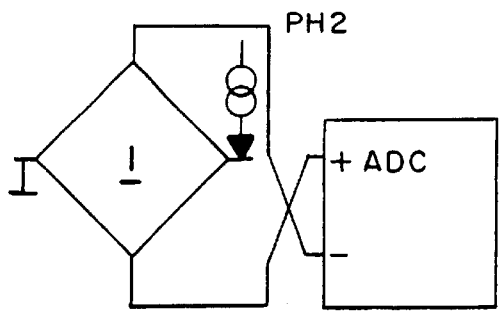

The stress measurement according to FIGS. 2a and 2b is based on the same basic principle as the magnetic field measurement of FIGS. 1a and 1b but with the difference that the supply of the Hall sensor supply current in the second half phase PH2 is directed counter to the current supply of the magnetic field measurement. The consequence is that upon summation of the two orthogonal Hall voltages the portions for the magnetic field are compensated while the stress-caused offset errors are not compensated and can thus be measured as a signal and further processed. Accordingly, the stress-related voltage can be measured and can be used for examination and testing of the complete system as well as for compensation of errors.

Figure 3A:
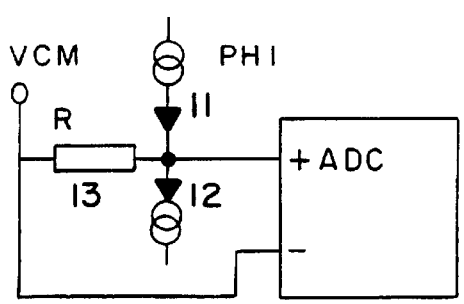
FIGS. 3a, 3b show the principle circuitry of the temperature measurement.
Figure 3B:
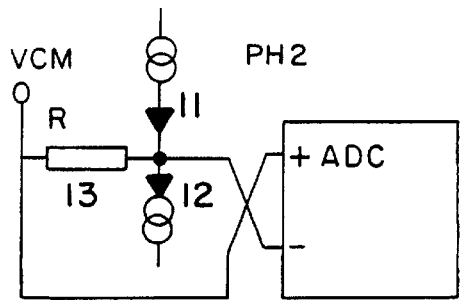
Figure 4:
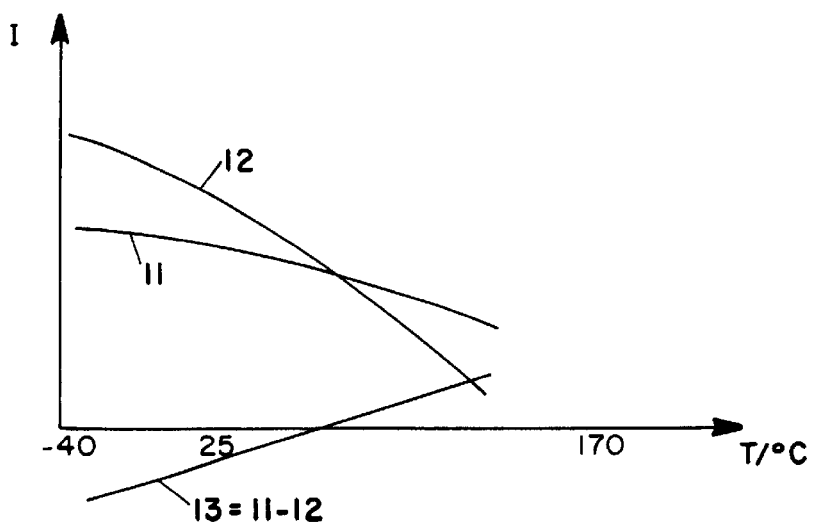
FIG. 4 shows a diagram with the different temperature coefficients for the temperature measurement according to FIGS. 3a, 3b.

The temperature measurement according to FIGS. 3a and 3b employs currents which are already present in the switching arrangement of the Hall sensors. These currents have different temperature coefficients. At the analog digital converter ADC the voltage VCM is present which is identical for both ADC input terminals. The current I3 has, for example, a positive temperature coefficient, as is shown in the diagram of FIG. 4. This current I3 results from the two partial currents I1 and I2. The first weak, negative partial current I1 is based on the band gap effect of a bipolar transistor. The second partial current I2 has, for example, a greatly negative temperature behavior as can be seen in the diagram of FIG. 4. The resulting current I3 corresponds to the differential current of the partial current I1 and the partial current I2 as shown in FIG. 4. This differential current generates at the resistor R a voltage drop which is measured by the analog digital converter ADC. Because of the temperature dependent different currents I1 and I2 at the resistor R, a temperature dependent voltage is thus generated. For determining the temperature, this voltage is compared to a reference voltage, for example, of the band gap circuit. In the same manner, the temperature can be determined by comparison of the resulting current I3 with the reference current which is, for example, generated by the band gap circuit.

This means that with the Hall currents present with in the Hall sensor circuitry and having different temperature coefficients the temperature of the Hall sensor can be determined.

Figure 5:
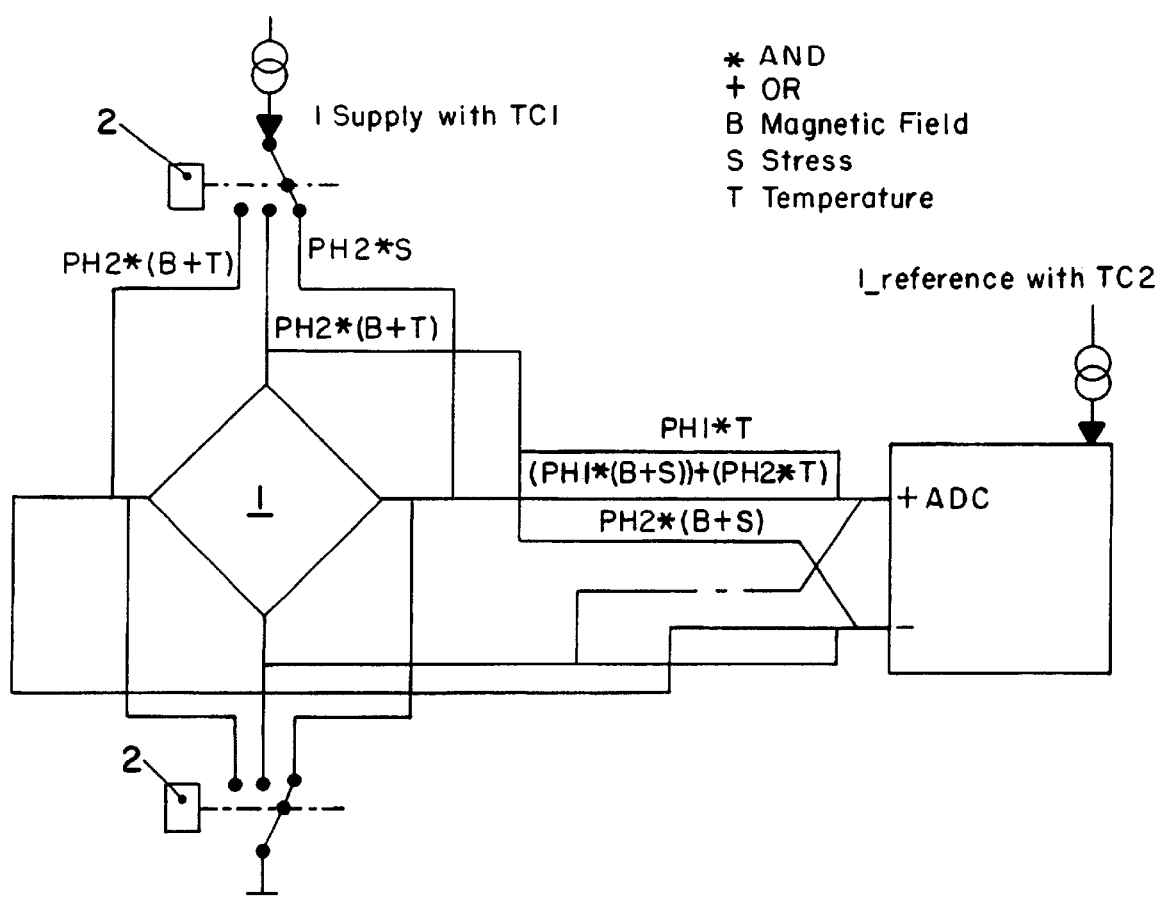
FIG. 5 shows a common basic circuitry for the magnetic field measurement, stress measurement as well as temperature measurement of FIGS. 1a, 1b through FIGS. 3a, 3b.

FIG. 5 shows the combination of the individual circuitry of FIGS. 1a and 1b, FIGS. 2a and 2b, as well as FIGS. 3a and 3b to a basic circuit diagram. With a respective control of switches 2, the three different measurements (magnetic field, stress, temperature) by orthogonal switching can be performed.

Figures 6A, 6B:
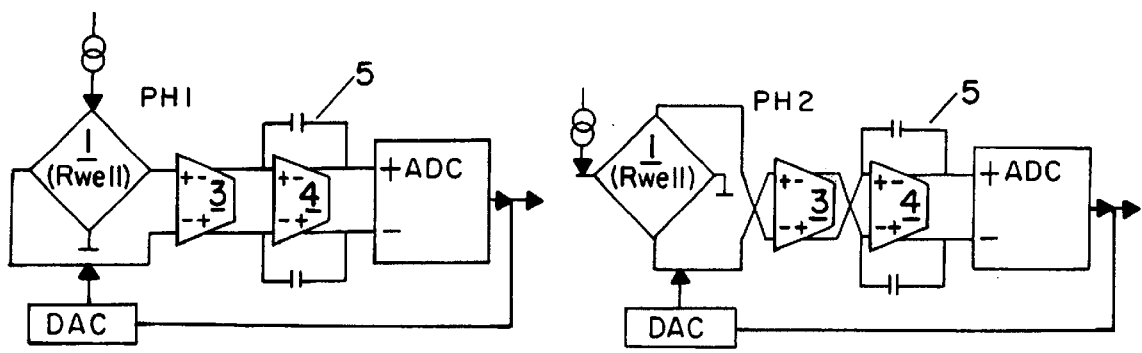
FIGS. 6a, 6b show a switching circuitry for the magnetic field measurement based on FIGS. 1a and 1b.

FIGS. 6a and 6b show based on the basic circuitry shown in FIGS. 1a and 1b the technical realization for the magnetic measurement. A first amplifier 3, for example, an operational transconductance amplifier (OTA) converts the Hall voltage into a differential current. In the second amplifier 4 arranged downstream thereof, for example, also embodied as an OTA or an operational amplifier (OPV), the differential current pair is integrated via parallel switched capacitors 5. The resulting voltages at the capacitors is then digitalized in an analog digital converter ADC and is then supplied as a digital Hall voltage measuring value. The thus generated digital signal can be converted by a digital analog converter DAC into a counter coupling signal. In the discussed embodiment, the DAC current is converted via the inner resistor of the Hall plate 1 from a counter coupling signal into a counter coupling voltage so that the Hall voltage measuring system at the input of the third amplifier 3 is zero volts overtime. Accordingly, the counter coupling voltage compensates the Hall voltage and the digital ADC output signal is a measure for the Hall voltage (delta sigma converter principle).

Figures 7A, 7B:
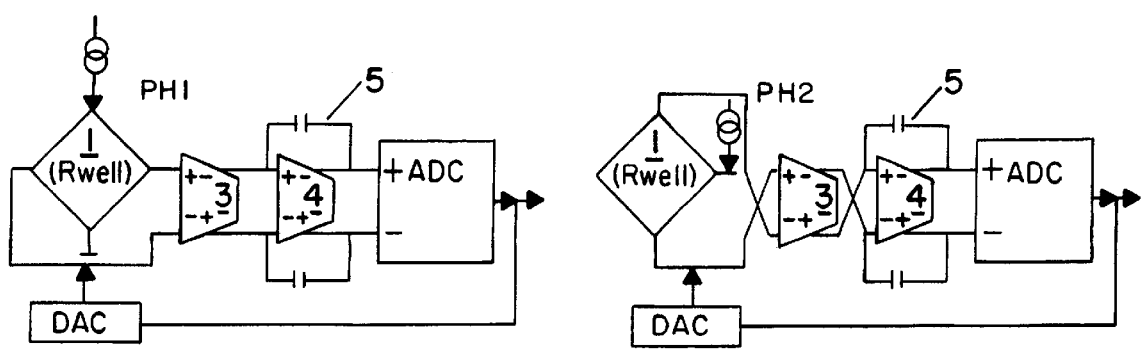
FIGS. 7a, 7b show a switching circuitry for the stress measurement based on FIGS. 2a, 2b.
Figures 8A, 8B:
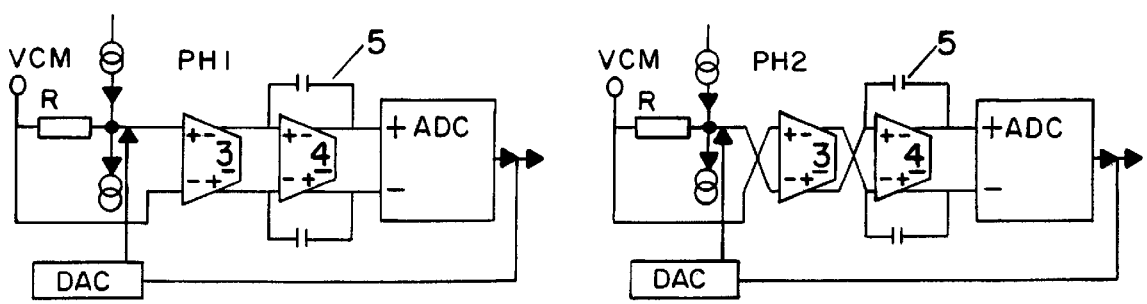
FIGS. 8a, 8b show a switching circuitry for the temperature measurement based on FIGS. 3a, 3b.

The stress measurement of FIGS. 7a and 7b as well as the temperature measurement of FIGS. 8a and 8b is performed in an analog fashion.

The specification incorporates by reference the disclosure of German priority document 198 58 868.2 of Dec. 19, 1998.

The present invention is, of course, in no way restricted to the specific disclosure of the specification and drawings, but also encompasses any modifications within the scope of the appended claims.

What is claimed is:

1. A Hall sensor comprising:
   a Hall plate having terminals for supplying a supply current and for tapping a Hall voltage;
   a Hall circuit connecting said terminals;
   a device for orthogonally switching the supply current and the Hall voltage between a first set of said terminals and a second set of said terminals arranged orthogonally to said first set of said terminals, wherein a geometry of said Hall plate is identical for said first and second set of said terminals;

a summation device configured to receive measured Hall voltage values from said first and second sets of said terminals and to determine an offset-compensated Hall voltage value;

said summation device configured to receive and/or process the Hall voltage values of said first and second set of said terminals such that, for stress measurement, portions of the Hall voltage values resulting from the magnetic field acting on the Hall sensors are compensated and only portions of the Hall voltage values resulting from the offset are measured;

wherein during orthogonally switching the supply current is switched by 180° in comparison to the orthogonal switching of the Hall voltage for determining an offset-compensated Hall voltage value for the stress measurement, while the orthogonal switching of the Hall voltage tapping remains unchanged in comparison to the orthogonal switching for determining the offset-compensated Hall voltage value.

2. A hall sensor comprising:

a Hall plate having terminals for supplying a supply current and for tapping a Hall voltage;

a Hall circuit connecting said terminals;

a device for orthogonally switching the supply current and the Hall voltage between a first set of said terminals and a second set of said terminals arranged orthogonally to said first set of said terminals, wherein a geometry of said Hall plate is identical for said first and second set of said terminals;

a summation device configured to receive measured Hall voltage values from said first and second sets of said terminals and to determine an offset-compensated Hall voltage value;

said Hall circuit comprising a resistor;

wherein, for temperature measurement, at least one current of said Hall sensor circuit having a predetermined temperature coefficient is used whose voltage drop at said resistor is determined for temperature measurement;

wherein only one of said currents of said Hall sensor circuit having a different temperature coefficient is used.

3. A Hall sensor according to claim 2, further comprising a bandgap circuit with bipolar transistors for generating at least one of said currents.

4. A Hall sensor according to claim 2, wherein said Hall plate is configured to act as said resistor.

5. A hall sensor comprising:

a Hall plate having terminals for supplying a supply current and for tapping a Hall voltage;

a Hall circuit connecting said terminals;

a device for orthogonally switching the supply current and the Hall voltage between a first set of said terminals and a second set of said terminals arranged orthogonally to said first set of said terminals, wherein a geometry of said Hall plate is identical for said first and second set of said terminals;

a summation device configured to receive measured Hall voltage values from said first and second sets of said terminals and to determine an offset compensated Hall voltage value;

said Hall circuit comprising a resistor;

wherein, for temperature measurement, at least one current of said Hall sensor circuit having a predetermined temperature coefficient is used whose voltage drop at said resistor is determined for temperature measurement;

wherein two of said currents of said Hall sensor circuit having different temperature coefficients are added or subtracted from one another.

6. A Hall sensor according to claim 5, wherein one of said currents is switched to a current distribution point and a resulting partial current is passed through said resistor, wherein the resulting voltage drop is used for further signal processing.

7. A Hall sensor according to claim 6, wherein said one current has a first temperature coefficient and wherein said partial current has a second temperature coefficient.

8. A Hall sensor comprising:

a Hall plate having terminals for supplying a supply current and for tapping a Hall voltage;

a Hall circuit connecting said terminals;

a device for orthogonally switching the supply current and the Hall voltage between a first set of said terminals and a second set of said terminals arranged orthogonally to said first set of said terminals, wherein a geometry of said Hall plate is identical for said first and second set of said terminals;

a summation device configured to receive measured Hall voltage values from said first and second sets of said terminals and to determine an offset-compensated Hall voltage value;

said summation device configured to receive and/or process the Hall voltage values of said first and second set of said terminals such that, for stress measurement, a portion of the Hall voltage values resulting from the magnetic field acting on the Hall sensor are compensated and only the portion of the Hall voltage values resulting from the offset are measured;

said Hall circuit comprising a resistor;

wherein, for temperature measurement, at least one current of said Hall sensor circuit having a predetermined temperature coefficient is used whose voltage drop at said resistor is determined for temperature measurement.

9. A Hall sensor according to claim 8, comprising a common switch device for the measurement of the magnetic field, of the stress, and of the temperature measurements for selectively activating one of the three measurements.

10. A Hall sensor according to claim 9, wherein for processing of the signals the signals are digitalized by an analog-digital converter.

11. A Hall sensor according to claim 8, comprising a device for compensating the Hall voltage and/or the stress voltage and/or the temperature voltage by a counter coupling voltage.

12. A Hall sensor according to claim 11, comprising a delta-sigma converter of a first or higher order for digitalization of the signals.

13. A Hall sensor comprising a Hall plate having terminals for supplying a supply current and for tapping a Hall voltage;

a Hall circuit connecting said terminals;

a device for orthogonally switching the supply current and the Hall voltage between a first set of said terminals and a second set of said terminals arranged orthogonally to said first set of said terminals, wherein a geometry of said Hall plate is identical for said first and second set of said terminals;

a summation device configured to receive measured Hall voltage values from said first and second sets of said terminals and to determine an offset-compensated Hall voltage value;

said summation device configured to receive and/or process the Hall voltage values of said first and second set of said terminals such that, for stress measurement, a portion of the Hall voltage values resulting from the magnetic field acting on the Hall sensor are compensated and only portion of the Hall voltage values resulting from the offset are measured;

said Hall circuit comprising a resistor;

wherein, for temperature measurement, at least one current of said Hall sensor circuit having a predetermined temperature coefficient is used whose voltage drop at said resistor is determined for temperature measurement;

a device for compensating the Hall voltage and/or the stress voltage and/or the temperature voltage by a counter coupling voltage;

a first amplifier for converting the Hall voltage into a current;

an additional stage downstream of the first amplifier, said additional stage comprising a second amplifier and an integrator for integrating and processing the current; and a device for converting said voltage signal into a counter coupling signal.

14. A Hall sensor according to claim 13, wherein said first amplifier converts said Hall voltage into a differential current pair.

15. A Hall sensor according to claim 13, wherein said device for converting said voltage signal digitalizes said voltage signal into said counter coupling signal.

16. A Hall sensor according to claim 13, comprising a common switch device for the measurement of the magnetic field, of the stress, and of the temperature measurements for selectively activating one of the three measurements.

17. A Hall sensor according to claim 16, wherein for processing of the signals the signals are digitalized by an analog-digital converter.

18. A Hall sensor according to claim 13, comprising a delta-sigma converter of a first or higher order for digitalization of the signals.

* * * * *